(12) United States Patent
Baeckler (10) Patent No.: US 7,636,655 B1
(45) Date of Patent: Dec. 22, 2009

(54) EXTRACTING SYNCHRONOUS SECONDARY SIGNALS BY FUNCTIONAL ANALYSIS

(75) Inventor: Gregg Baeckler, San Jose, CA (US)

(73) Assignee: Altera Corporation, San Jose, CA (US)

( * ) Notice: Subject to any disclaimer, the term of this patent is extended or adjusted under 35 U.S.C. 154(b) by 493 days.

(21) Appl. No.: 10/731,593

(22) Filed: Dec. 8, 2003

(51) Int. Cl.
- G06F 17/50 (2006.01)
- G06F 17/00 (2006.01)
- G06F 3/00 (2006.01)
- G06F 11/00 (2006.01)
- G06F 13/10 (2006.01)
- G06F 13/00 (2006.01)
- H03K 17/693 (2006.01)

(52) U.S. Cl. .............. 703/21; 703/13; 703/14; 710/8; 714/34; 716/1; 716/2; 716/3; 716/4; 716/5; 716/9; 716/10; 716/16

(58) Field of Classification Search ........ 716/1–5, 716/9–10, 16; 703/13–14, 21; 710/8; 714/34
See application file for complete search history.

(56) References Cited

U.S. PATENT DOCUMENTS

| | | | | |
|---|---|---|---|---|
| 5,748,488 | A * | 5/1998 | Gregory et al. | 716/18 |
| 6,026,230 | A * | 2/2000 | Lin et al. | 703/13 |
| 6,086,626 | A * | 7/2000 | Jain et al. | 716/5 |
| 6,195,788 | B1 * | 2/2001 | Leaver et al. | 716/18 |
| 6,526,557 | B1 * | 2/2003 | Young et al. | 716/16 |
| 6,990,650 | B2 * | 1/2006 | Teig et al. | 716/12 |
| 7,020,855 | B2 * | 3/2006 | Wallace | 716/2 |
| 7,020,864 | B1 * | 3/2006 | Loong | 716/16 |

OTHER PUBLICATIONS

Lee et al. "Performance evaluation and optimal design for FPGA-based digit-serial DSP functions", Nov. 15, 2002, Science Direct, http://www.sciencedirect.com, 21 pages.*
Vemuri et al. "BDD-Based Logic Synthesis for LUT-Based FPGAs", Oct. 2002, ACM Transactions on Design Automation of Electronic Systems, vol. 7, No. 4, pp. 501-525.*
Cong et al. "Cut Ranking and Pruning: Enabling a General and Efficient FPGA Mapping Solution", 1999, ACM, pp. 29-35.*

* cited by examiner

*Primary Examiner*—Kamini S Shah
*Assistant Examiner*—Suzanne Lo
(74) *Attorney, Agent, or Firm*—Townsend and Townsend and Crew LLP (57) ABSTRACT

Programmable devices include configurable logic hardware for implementing logic gates, registers for storing data, and secondary hardware for additional functions, such as loading and clearing. The secondary hardware can implement portions of the user design, thereby decreasing the number of gates to be implemented elsewhere. A set of possible alternative implementations of portions of the user design is identified by enumerating the inputs connected with a register. Logic diagrams are created for the set of inputs, and alternative implementations are identified from the logic diagrams by recognizing patterns similar to the secondary hardware functions. To determine an implementation that balances gate savings against routing costs, alternative implementations are grouped according to compatible inputs and ranked by the number of registers in each group. The implementation with the highest rank is selected, and selected registers are removed from other alternative implementations. The remaining alternative implementations are re-ranked for further selections.

32 Claims, 11 Drawing Sheets

EXTRACTING SYNCHRONOUS SECONDARY SIGNALS BY FUNCTIONAL ANALYSIS

BACKGROUND OF THE INVENTION

The present invention relates to the field of programmable devices, and the systems and methods for programming the same. Programmable devices, such as FPGAs, typically includes thousands of programmable logic cells that use either a combination of logic gates or a look-up table to perform a logic operation. Programmable devices also include a number of functional blocks having specialized logic devices adapted to a specific logic operations. The logic cells and functional blocks are interconnected with a configurable switching circuit. The configurable switching circuit selectively routes connections between the logic cells and functional blocks. By configuring the combination of logic cells, functional blocks, and the switching circuit, a programmable device can be adapted to perform virtually any type of information processing function.

A typical design cycle for determining the configuration of a programmable device includes starts with an extraction phase, followed by a synthesis phase, a fitting phase, and an assembly phase. The extraction phase takes a user design, typically expressed in a hardware description language such as verilog or VHDL, and produces a set of logic gates implementing the user design. In the synthesis phase, the set of logic gates is permutated over the hardware architecture of the programmable device in order to match elements of the user design with corresponding portions of the programmable device. The fitting or routing phase assigns the various portions of the user design to specific logic cells and functional blocks of the programmable device, taking care to minimize the length and number of connections needed by the switching circuit. In the assembly phase, a configuration file defining the programmable device configuration is created. The configuration can then be loaded into a programmable device to implement the user design.

Many programmable devices implement logic cells as one or more configurable look-up tables for implementing logic functions, one or more registers for storing data values, and some additional hardware for secondary functions, such as load and clear functions. The load and clear functions reset the value of a logic cell register to zero or to an initial value and are typically used for initializing a logic cell, for example at system start-up or at the beginning of a loop. The load and clear hardware is also used in arithmetic chains. This hardware is typically unused for other applications.

In theory, the secondary hardware in logic cells can also be used to implement other logic functions, thereby decreasing the number of gates that need to be implemented with look-up tables or other hardware and improving the performance and efficiency of the programmable device. As the load and clear hardware is typically unused outside of a few narrow applications, implementing logic functions in this manner is "free" and does not consume additional device resources.

However, secondary hardware is rarely exploited for this purpose because of the difficulties in matching dissimilar portions of a user design with the structure of the load and clear hardware. Prior approaches, such as design templates matching user design patterns with logic cell hardware, typically miss user designs that trivially deviate from the design templates and require user designs to rigidly adhere to complex design rules. Furthermore, when secondary hardware is used for too much of a user design, the routing phase will require an excess amount of connections from the switching circuit, resulting in a net decrease in performance and efficiency. Additionally, many user designs can be implemented with secondary hardware in a number of different alternative configurations. Often, the choice of configuration is incompatible with neighboring logic cells and can result in excess and inefficient connections from the switching circuit.

It is therefore desirable for a system and method of synthesis to efficiently exploit the secondary hardware of logic cells in implementing a wide variety of user designs, regardless of the similarity between the user design and the structure of the secondary hardware. It is further desirable that the system and method of synthesis does not detrimentally impact the amount of connections required by the switching circuit in the fitting phase.

BRIEF SUMMARY OF THE INVENTION

Programmable devices include configurable logic hardware for implementing logic gates, registers for storing data, and secondary hardware for additional functions, such as loading and clearing. The secondary hardware can implement portions of the user design, thereby decreasing the number of gates to be implemented elsewhere. A set of possible alternative implementations of portions of the user design is identified by enumerating the inputs connected with a register. Logic diagrams are created for the set of inputs, and alternative implementations are identified from the logic diagrams by recognizing patterns similar to the secondary hardware functions. To determine an implementation that balances gate savings against routing costs, alternative implementations are grouped according to compatible inputs and ranked by the number of registers in each group. The implementation with the highest rank is selected, and selected registers are removed from other alternative implementations. The remaining alternative implementations are re-ranked to select further implementations.

In an embodiment, a method of determining an implementation of a user design on a programmable device including reconfigurable logic hardware and fixed-configuration secondary hardware comprises determining a plurality of potential input assignments for a portion of the user design corresponding with at least one function of the fixed-configuration hardware, ranking the plurality of potential input assignments, and selecting the highest ranked input assignment as an implementation of at least a subset of the portion of the user design. In one implementation, the fixed-configuration secondary hardware enables load and clear functions of a register of the programmable device.

Each of the plurality of potential input assignments defines an assignment of at least one input variable of the user design to an input of the fixed configuration secondary hardware. In an embodiment, each of the plurality of potential input assignments is associated with at least one register of the user design.

In a further embodiment, ranking the plurality of potential input assignments includes determining the number of registers of the user design associated with each of the plurality of potential input assignments. The potential input assignment with the most associated registers is from the plurality of potential input assignments. In yet a further embodiment, the selected potential input assignment is removed from the plurality of potential input assignments, and registers associated with the selected potential input assignment are disassociated from other potential input assignments.

In still another embodiment, a criteria of the remaining plurality of potential input assignments is evaluated, and in response to a determination that the criteria exceeds a threshold, the method is reiterated for the remaining plurality of potential input assignments.

BRIEF DESCRIPTION OF THE DRAWINGS

The invention will be described with reference to the drawings, in which.

DETAILED DESCRIPTION OF THE INVENTION

Figure 1:
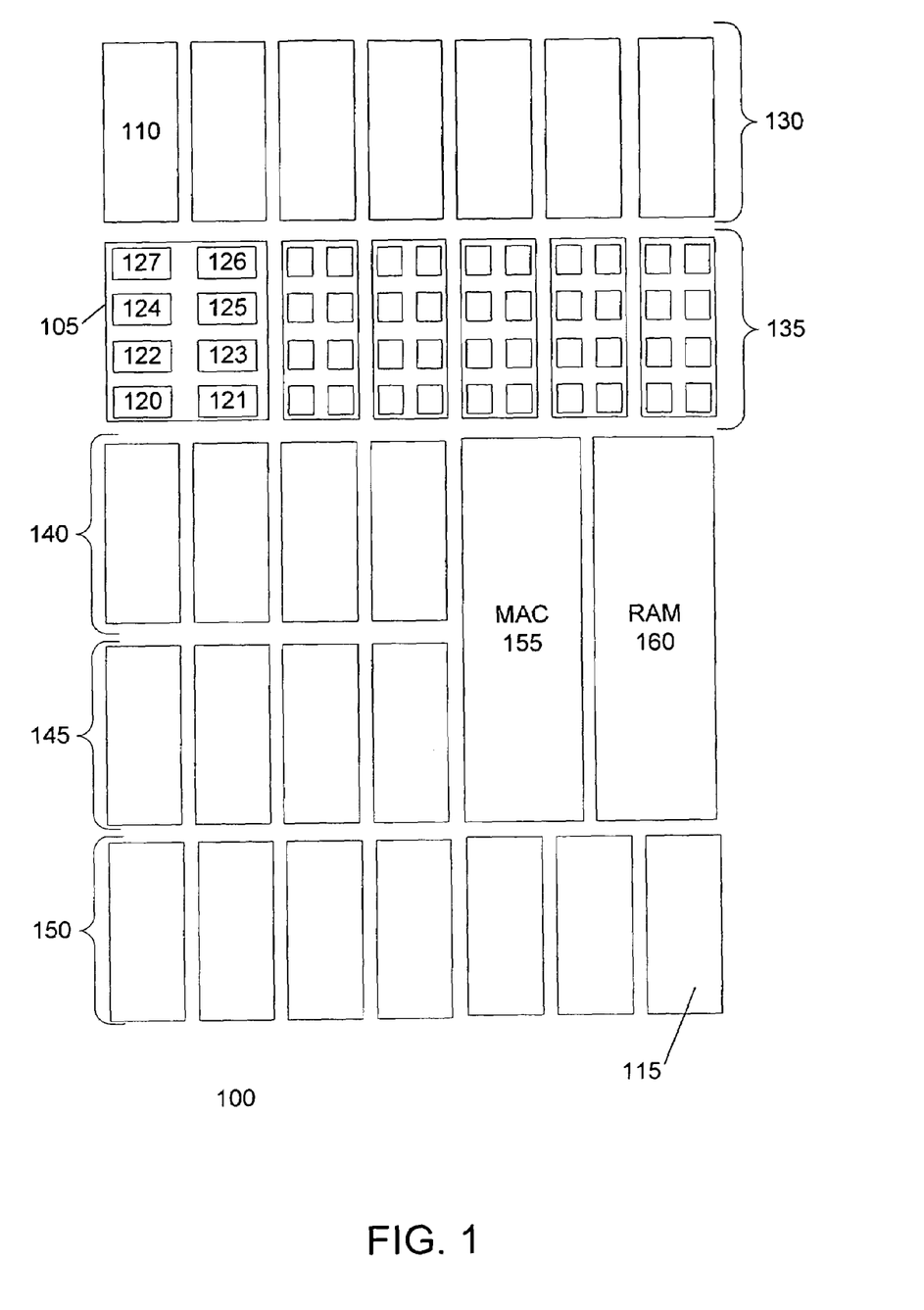
FIG. 1 illustrates a portion of an example programmable device suitable for use with an embodiment of the invention.

FIG. 1 illustrates a portion of an example programmable device 100 suitable for use with an embodiment of the invention. Programmable device 100 includes a number of logic array blocks (LABs), such as LABs 105, 110, 115. Each LAB includes a number of programmable logic cells using logic gates and/or look-up tables to perform a logic operation. LAB 105 illustrates in detail logic cells 120, 121, 122, 123, 124, 125, 126, and 127. Logic cells are omitted from other LABs in FIG. 1 for clarity. The LABs of device 100 are arranged into rows 130, 135, 140, 145, and 150. In an embodiment, the arrangement of logic cells within a LAB and of LABs within rows provides a hierarchical system of configurable connections, in which connections between logic cells within a LAB, between cells in different LABs in the same row, and between cell in LABs in different rows require progressively more resources and operate less efficiently.

In addition to logic cells arranged in LABs, programmable device 100 also include specialized functional blocks, such as multiply and accumulate block (MAC) 155 and random access memory block (RAM) 160. For clarity, the portion of the programmable device 100 shown in FIG. 1 only includes a small number of logic cells, LABs, and functional blocks. Typical programmable devices will include thousands or tens of thousands of these elements.

Figure 2:
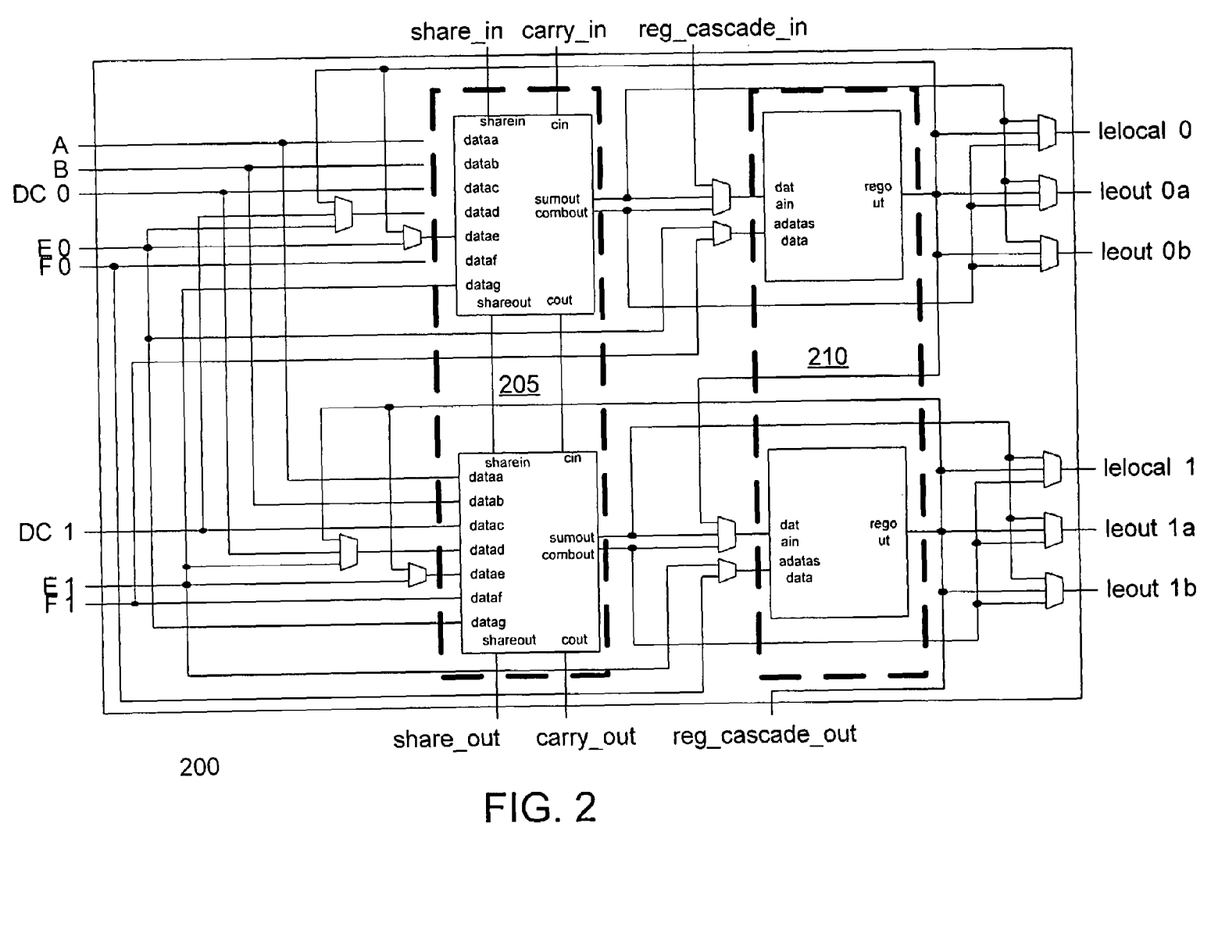
FIG. 2 illustrates an example logic cell of a programmable device suitable for use with an embodiment of the invention.

FIG. 2 illustrates an example logic cell 200 of a programmable device suitable for use with an embodiment of the invention. Logic cell 200 includes a pair of look-up tables 205 and a pair of registers 210. In an embodiment, each register is functionally equivalent to a D-type flip-flop. Between the look-up tables 205 and the registers 210 is a pair of synchronous secondary hardware, one for each register, which in this embodiment enables load and clear functions for the registers. However, as discussed below, the invention can be applied to secondary hardware enabling any function.

The look-up tables can be configured to implement virtually any type of logic function. Unlike the configurable look-ups tables, secondary hardware is fixed in configuration and cannot be changed. Despite this limitation, secondary hardware can be used to implement portions of the user design that are similar in function to the secondary hardware. Because the secondary hardware is built into each logic cell, implementing portions of user designs with secondary hardware reduces the amount of gates needed by the more flexible look-up table.

Figure 3:
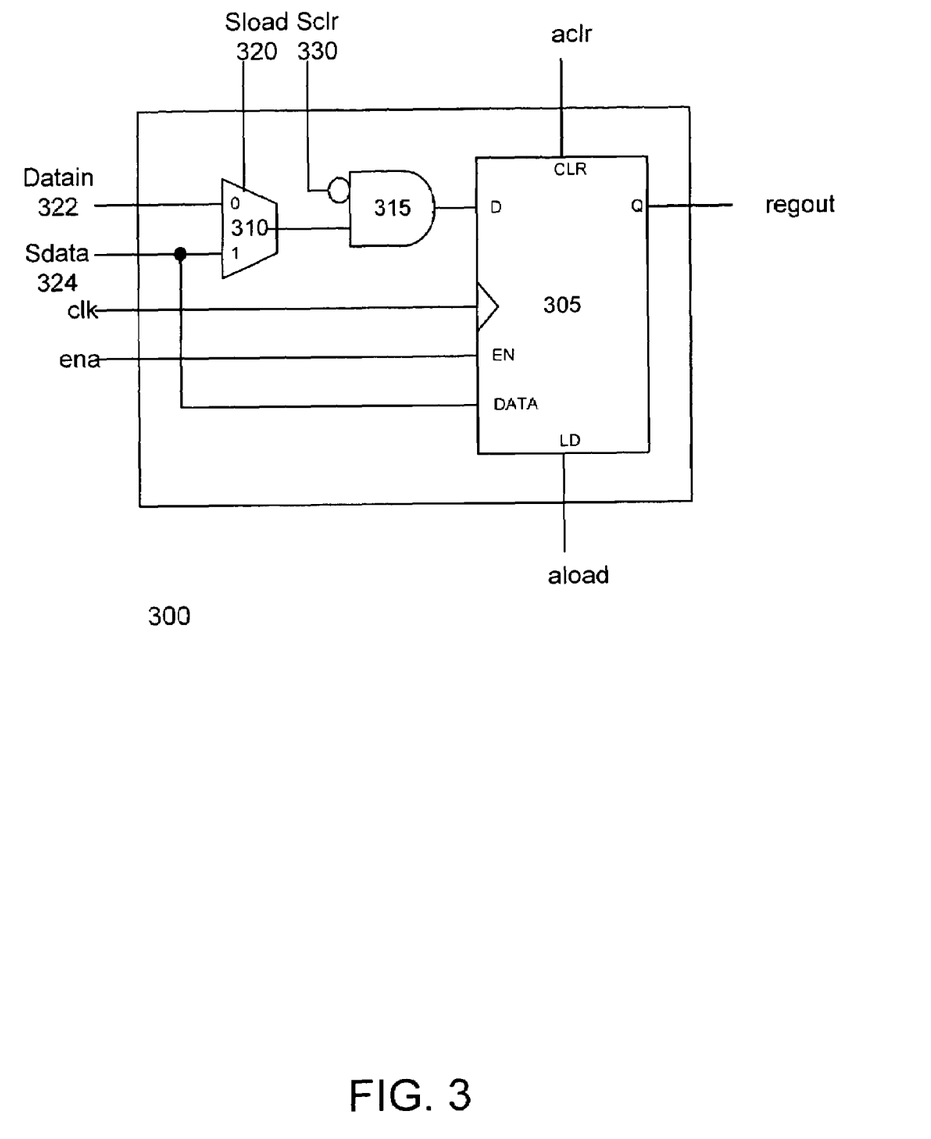
FIG. 3 is a simplified portion of an example logic cell illustrating the application of an embodiment of the invention.

FIG. 3 is a simplified detail view 300 of the load and clear hardware and the register for a portion of an example logic cell. Register 305 is a D-type flip-flop. In this example logic cell, the load and clear hardware are implemented as a combination of a 2-into-1 multiplexer 310 and an AND gate 315. The synchronous load line (sload) 320 controls multiplexer 310, such that the multiplexer output 310 can be switched between a data line 322 connected with the output of a look-up table and a synchronous data line (sdata) 324, which is used to initialize the register to a default or initial value. The output of multiplexer 310 is fed into AND gate 315. Synchronous clear line (sclear) 330 is the other input of AND gate 315. When sclear 330 is asserted, the output of the AND gate 315, and hence the value of register 305, is 0. When the sclear 330 is not asserted and sload 320 is asserted, the value of the register 305 is the value of sdata 324. When both the sclear 330 and sload 320 are unasserted, the value of data line 322 is passed through to register 305.

The combination of the AND gate and multiplexer used in the secondary hardware can be exploited to implement portions of a user design, thereby decreasing the number of gates that need to be implemented with look-up tables or other hardware and improving the performance and efficiency of the programmable device. In many cases, there may be several different alternative implementations of a user design on the secondary hardware. As discussed below, selecting the right implementation of a user design on the secondary hardware can greatly affect the amount of connections needed for the fitting phase.

Figure 4:
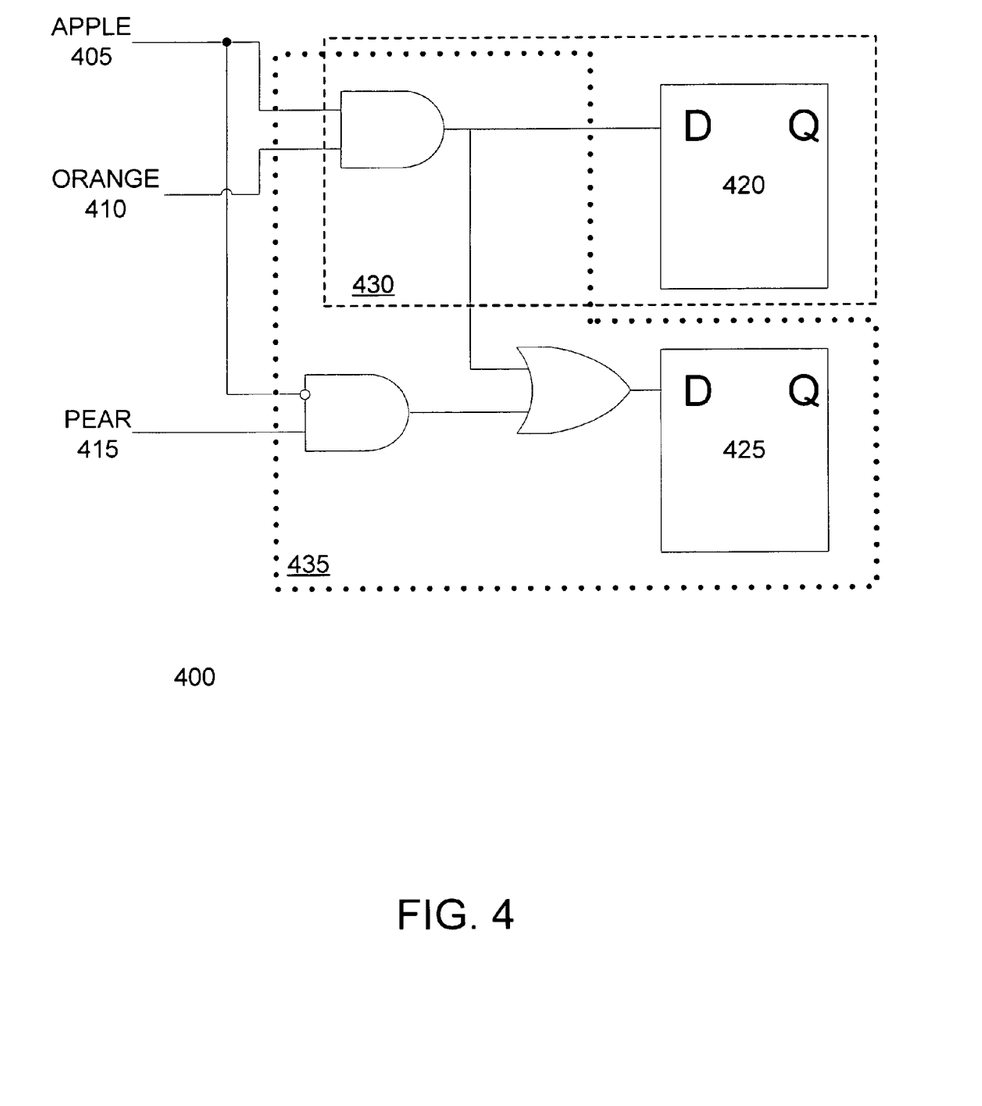
FIG. 4 illustrates two portions of an example user design to be adapted to example logic cells according to an embodiment of the invention.

FIG. 4 illustrates two portions of an example user design 400 to be adapted to example logic cells according to an embodiment of the invention. In implementing this example with secondary hardware, it will be shown how to maximize compatibility with neighboring logic cells to improve routing efficiency. User design 400 includes three inputs variables: apple 405, orange 410, and pear 415. User design 400 also includes two registers 420 and 425. The user design 400 can be divided into two portions: portion 430 implementing the input to register 420 and portion 435 implementing the input to register 425. The function of portion 430 can be defined by the Boolean equation:

D=APPLE◯ORANGE

Similarly, the function of portion 435 can be defined by the Boolean equation:

$D$=(APPLE◯ORANGE)+($\overline{\text{APPLE}}$◯PEAR)

FIGS. 5A, 5B, 5C, and 5D illustrate alternative adaptations of a first portion 430 of an example user design to an example logic cell according to an embodiment of the invention. Despite the differences, all four implementations are functionally equivalent to D=APPLE◯ORANGE.

Figure 5A:
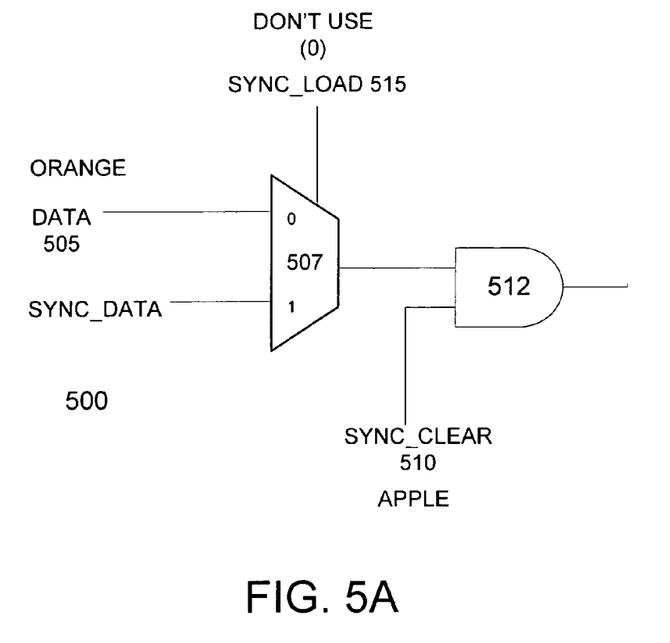
FIGS. 5A, 5B, 5C, and 5D illustrate alternative adaptations of a first portion of an example user design to an example logic cell according to an embodiment of the invention.

FIG. 5A illustrates the implementation 500 of portion 430 of user design 400 on example secondary hardware. In this implementation, the orange input variable is assigned to the data input 505 of multiplexer 507, the apple input variable is assigned to the sclear input 510 of AND gate, and the sload input 515 is held to 0 so that multiplexer 507 output is always the value of data line 505, which is assigned to the orange input variable in this implementation. Thus, the input to the AND gate 512 will always be orange, and the result will be: APPLE●ORANGE.

Figure 5B:
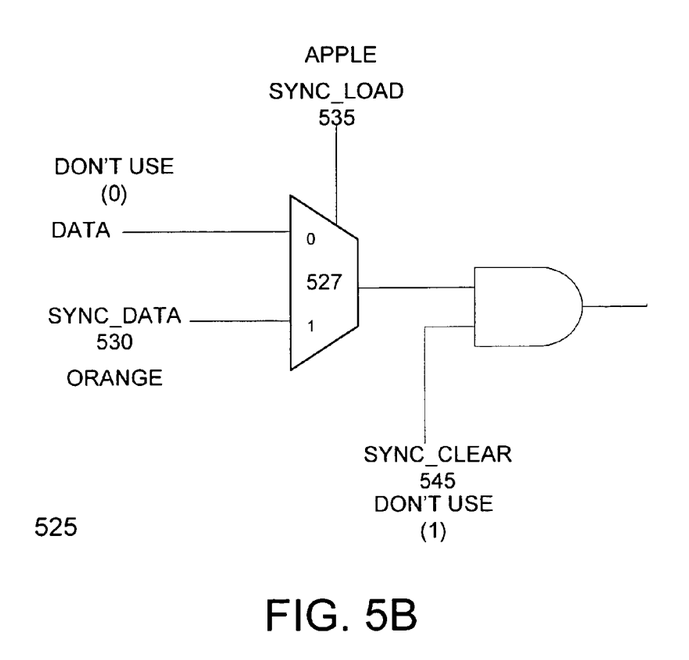

FIG. 5B illustrates a second implementation 525 of portion 430 of user design 400 on example secondary hardware. In this implementation, the orange input variable is assigned to the sdata input 530 of multiplexer 527 and the apple input variable is assigned to the sload input 535 of multiplexer 527. The data input 540 is held to 0 and the sclear input 545 is held to 1. When the apple input variable is 0, the result is 0. When apple is 1, the result will be 1 if orange is 1 and will be 0 if orange is 0. Thus, this implementation is equivalent to the implementation 500.

Figure 5C:
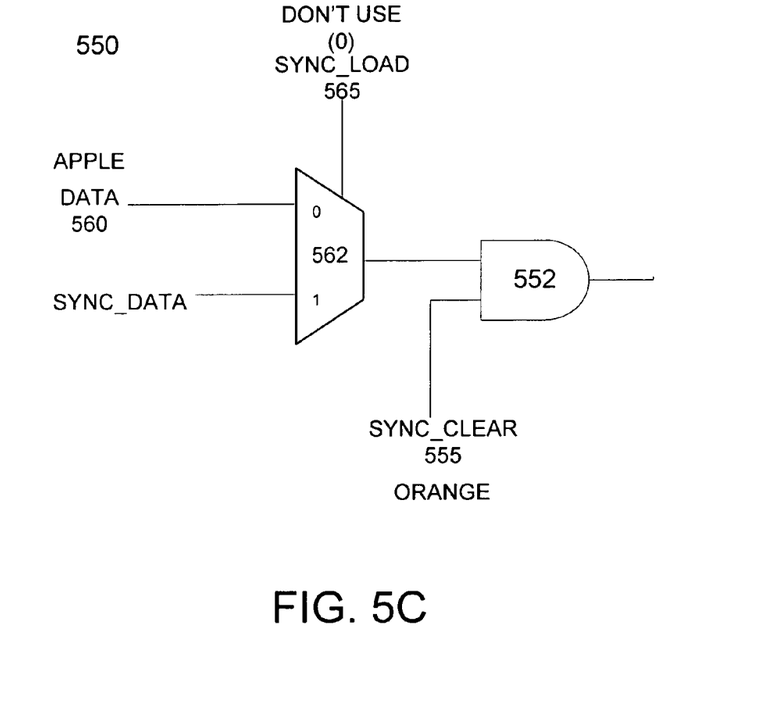

FIG. 5C illustrates a third implementation 550 of portion 430 of user design 400 on example secondary hardware. In this implementation, the orange input variable is assigned to the sclear 555 of AND gate 552 and the apple input variable is assigned to the data input 560 of multiplexer 562. The sload input 565 is held to 0, so that multiplexer 562 output is always the value of data line 560, which is assigned to the apple input variable in implementation 550. Thus, the output of multiplexer 562 will always be apple, and the result of AND gate 552 will be: APPLE●ORANGE.

Figure 5D:
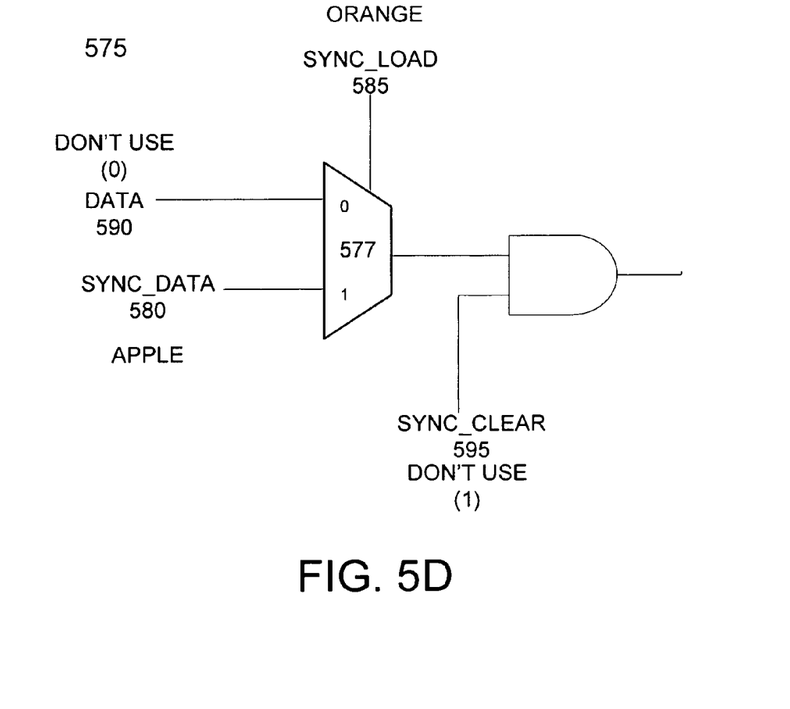

FIG. 5D illustrates a fourth implementation 575 of portion 430 of user design 400 on example secondary hardware. In this implementation, the apple input variable is assigned to the sdata input 580 of multiplexer 577 and the orange input variable is assigned to the sload input 585 of multiplexer 577. The data input 590 is held to 0 and the sclear input 595 is held to 1. When the orange input variable is 0, the result is 0. When orange is 1, the result will be 1 if apple is 1 and will be 0 if apple is 0. Thus, this implementation is equivalent to the implementation 500.

Figure 6:
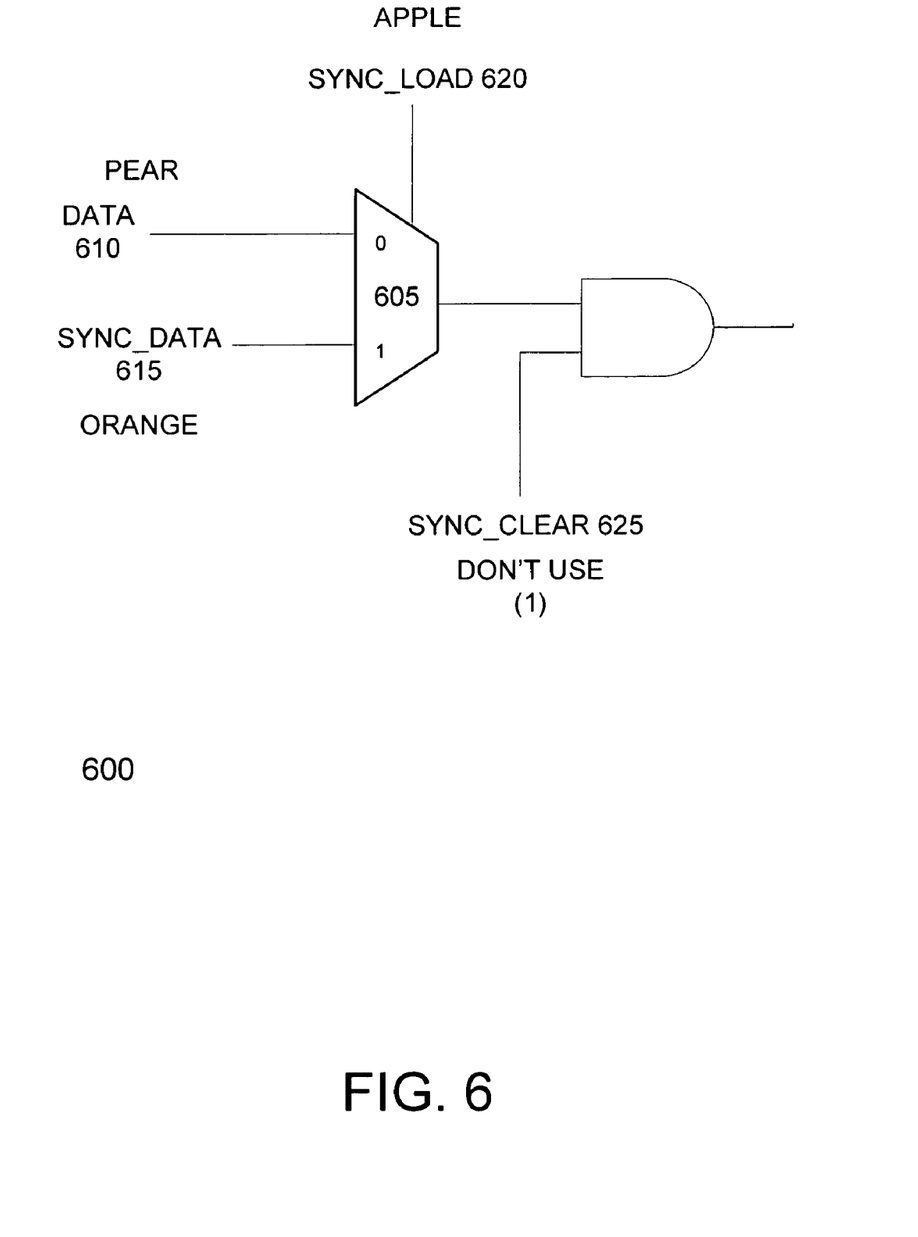
FIG. 6 illustrates an adaptation of second portion of a user design to an example logic cell according to an embodiment of the invention.

FIG. 6 illustrates an implementation 600 of second portion 435 of a user design 400 to an example logic cell according to an embodiment of the invention. Implementation 600 assigns the pear input variable to data line 610 of multiplexer 605, orange input variable to the sdata line 615, and apple input variable to sload 620. The sclear input 625 is set to 1. Implementation 600 is equivalent to the function: (APPLE●ORANGE)+(APPLE●PEAR)

Implementations 500, 525, 550, and 575 of portion 430 are all equivalent, and therefore interchangeable. To determine which implementation to select for the programmable device configuration, an embodiment of the invention seeks to minimize the cost in routing, or creating connections between logic cells. One way to minimize the routing cost is to use the same input assignments for as many logic cells as possible.

Turning to portion 435 of the user design 400, it can be seen that implementation 600 is the only valid implementation of this portion of the design using secondary hardware. Implementation 600 assigns the orange and apple input variables to the sdata line and sload line, respectively. To minimize routing costs, an implementation for portion 430 of user design 400 should be selected with a compatible input assignment. Implementation 525 of portion 430 assigns apple to sload and orange to sdata, which is the same input assignment used to implement portion 435 of the user design 400. Thus, from a routing cost perspective, the most efficient implementation of user design 400 will configure a first logic cell as shown in FIG. 5B to implement portion 430 and configure a second logic cell as shown in FIG. 6 to implement portion 435.

For complicated user designs, involving hundreds of thousands of logic cells and hundreds or thousands of inputs, the principles discussed in the preceding example are applied on a larger scale. In an embodiment, synthesizing a configuration of logic cells involves first identifying a set of possible alternative implementations of the user design on a combination of logic cell secondary hardware and other logic gates, look-up table hardware, and functional blocks. Once a set of possible solutions has been determined, an optimal solution is determined that balances the gate savings using secondary hardware in lieu of look-up tables or dedicated logic gates versus the routing costs for assigning inputs.

Figure 7:
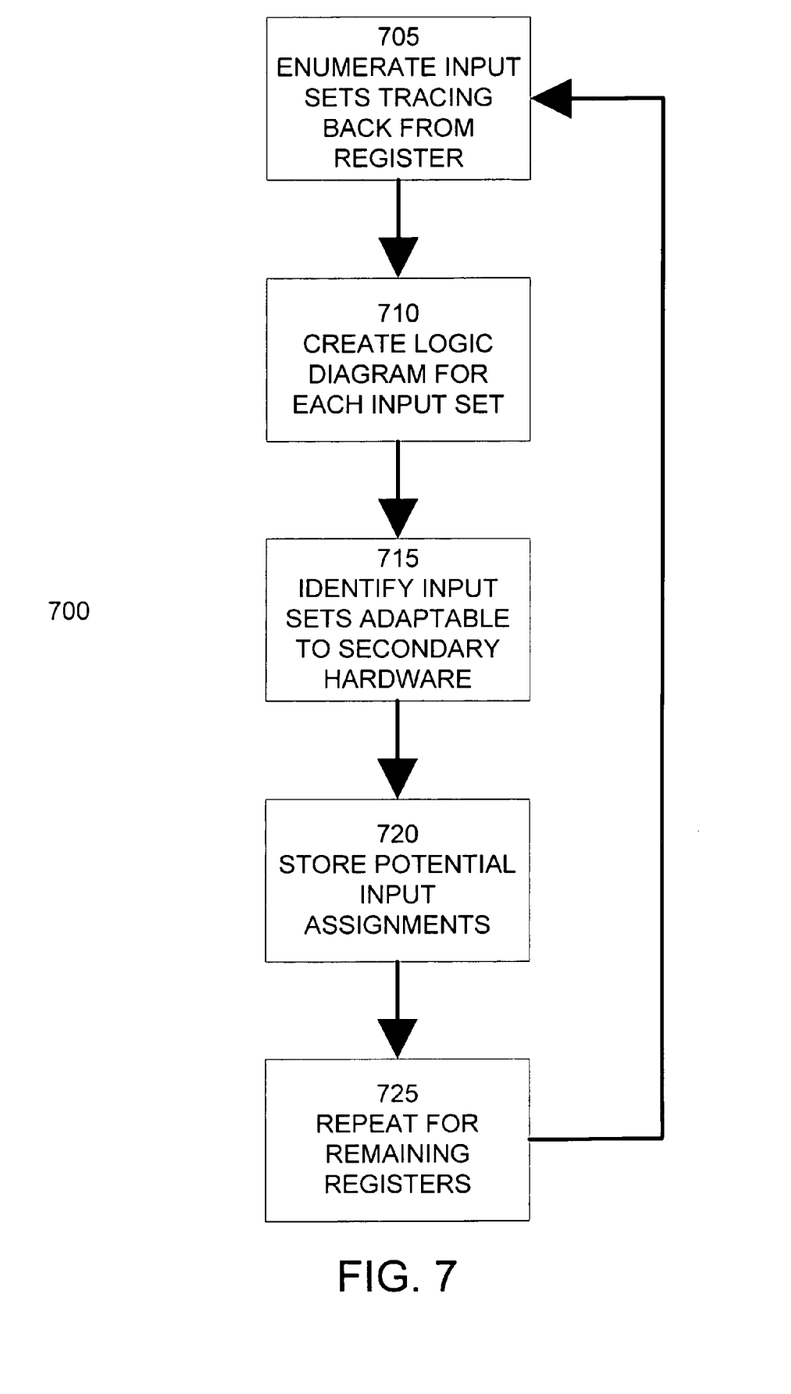
FIG. 7 illustrates a method for determining a set of potential implementation of a user design on a programmable device according to an embodiment of the invention.

FIG. 7 illustrates a method 700 for determining a set of potential implementations of a user design on a programmable device according to an embodiment of the invention. At step 705, a register in the user design is selected for analysis. Step 705 traces back from the input of the selected register to enumerate the sets of inputs connected with the selected register and their associated logic gates.

Figure 8:
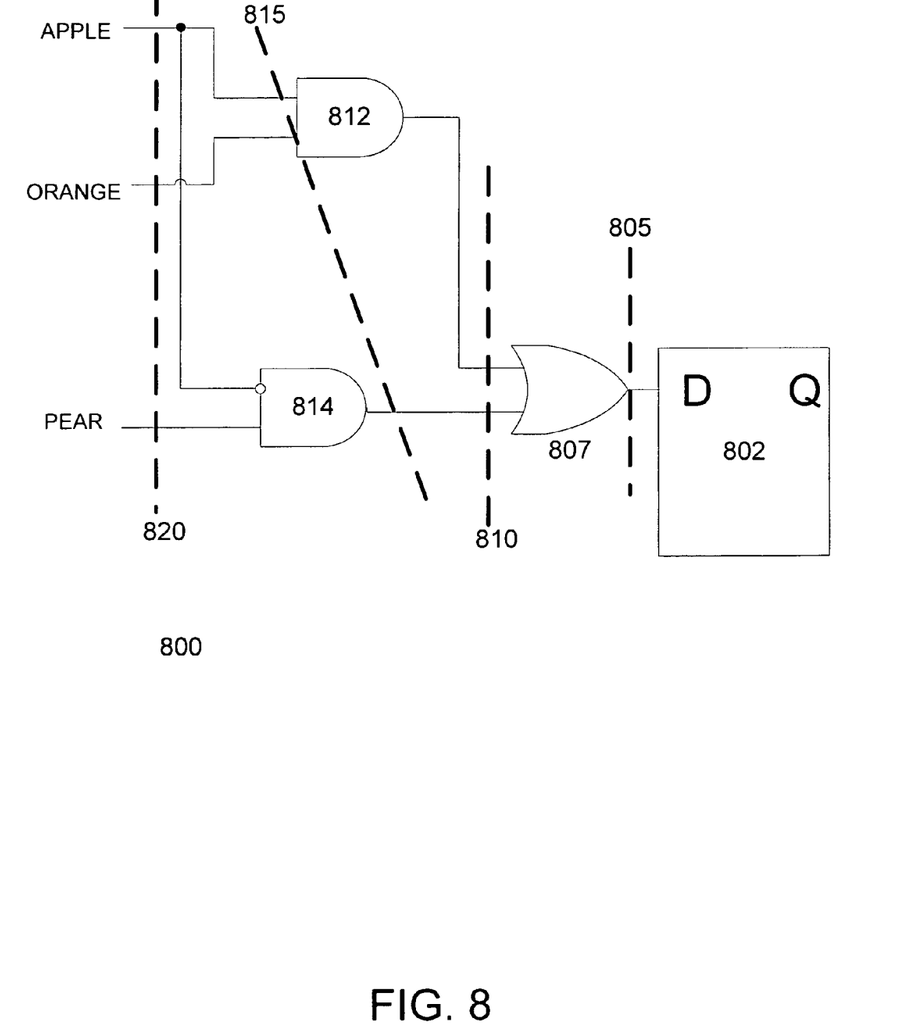
FIG. 8 illustrates the application of cut enumeration to an example user design according to an embodiment of the invention.

In an embodiment, step 705 uses cut enumeration, a common logic analysis technique, to identify all possible combinations of inputs. FIG. 8 illustrates the application of cut enumeration to an example user design 800. Cut enumeration "cuts" the input leads between each component to get a set of inputs from the view of each cut. For example, cut 805, between register 802 and gate 807, "sees" a single input, the output of gate 807. Cut 810 sees two inputs, the outputs of gates 812 and 814. Cut 815 sees three inputs: apple, orange, and the output of gate 814. Cut 820 also see three inputs: apple, orange, and pear. Cut 805 is referred to as a 1-cut, cut 810 as a 2-cut, and cuts 815 and 820 as 3-cuts.

In an embodiment of step 705, each input cut specifies a set of logic gates to be potentially implemented on secondary hardware. For example, cut 810 specifies gate 807 to be implemented on the secondary hardware, cut 815 specifies gates 812 and 807 to be implemented on secondary hardware, and cut 820 specifies gates 812, 814, and 807 to be implemented on secondary hardware. In a further embodiment, step 705 enumerates all possible combinations of gates up to a depth threshold, for example 50 gates, or up to specified number of inputs on a cut, for example a 4-cut.

In alternate embodiments, other logic analysis techniques, such as network flow computations, can be used to determine all possible combinations of inputs. Regardless of how the combinations of inputs are determined, at step 710, a logic diagram is created for each set of gates associated with an input combination. In an embodiment, the logic diagram is a truth table. Alternatively, the logic diagram is a Karnaugh map, or any other data structure used to represent Boolean functions.

At step 715, one or more adaptations of input sets to the secondary hardware are identified from each logic diagram. In an embodiment, a set of truth table utility functions are used to recognize all or portions of the Boolean function behaving as AND, OR, and 2-to-1 multiplexers. In this embodiment, these patterns are chosen because of their similarity to the function of the underlying secondary hardware. In alternate secondary hardware designs, different patterns matching the underlying hardware may be used. For example, if the secondary hardware includes two load multiplexers, which would eliminate the need for an sclear signal, then step 715 would be used to recognize logic patterns similar to the pair of multiplexers.

Once input patterns have been recognized, an embodiment of step 715 uses a set of heuristics to determine one or more sets of potential input assignments. An example embodiment uses heuristics based on the number of input cuts. Tables 1-4 illustrate example heuristics used for various size input cuts.

TABLE 1

Example 1-Cut Heuristics

| data | sload | sclear | sdata |
|---|---|---|---|
| input | 0 | 0 | don't care |
| input | don't care | 0 | input |
| 0 | input | 0 | 1 |
| 1 | !input | 0 | 0 |
| input | 0 | !input | don't care |
| don't care | input | !input | 1 |

TABLE 2

Example 2-Cut Heuristics

Consider 2-cuts as either:

One data signal and one sclear signal
One data signal and one sload of a constant value

TABLE 3

Example 3-Cut Heuristics

Consider 3-cuts as either:

A proper sload: one data signal, one sload signal, one sdata signal (e.g., a 2-to-1 multiplexer)
One data signal, one sload signal, one sclear signal, where sdata is either 0 or 1 (e.g. an AND followed by either an AND or an OR)

TABLE 4

Example 4-Cut Heuristics

Consider 4-cuts as:

A proper sload and a proper sclear.

In applying these heuristics to determine potential input assignments, there may be some portions of the user design that cannot be implemented using the secondary hardware. For example, an exclusive-or gate cannot be easily implemented on the example secondary hardware discussed above. Alternatively, the Boolean function defined by an input cut does not match any of the heuristics. For example, if heuristics are created for cuts up to 4-cuts, a 5-cut, such as that created by a five input AND gate, will be too large to be adapted to the example secondary hardware as a single unit. In a further embodiment, input cuts that are too large are broken down into smaller input cuts to fit the set of heuristics to be applied. For input cuts that cannot be adapted to the secondary hardware, traditional synthesis techniques are used to configure dedicated logic gates or look-up tables to perform the required function.

At step 720, the set of input cuts having potential input assignments using the secondary hardware are stored for further processing. Note that for a given input cut, there may be several alternative input assignments stored. At step 725, a different register from the user design is selected, and steps 705-720 are repeated until a set of potential input assignments is enumerated for all of the registers.

Figure 9:
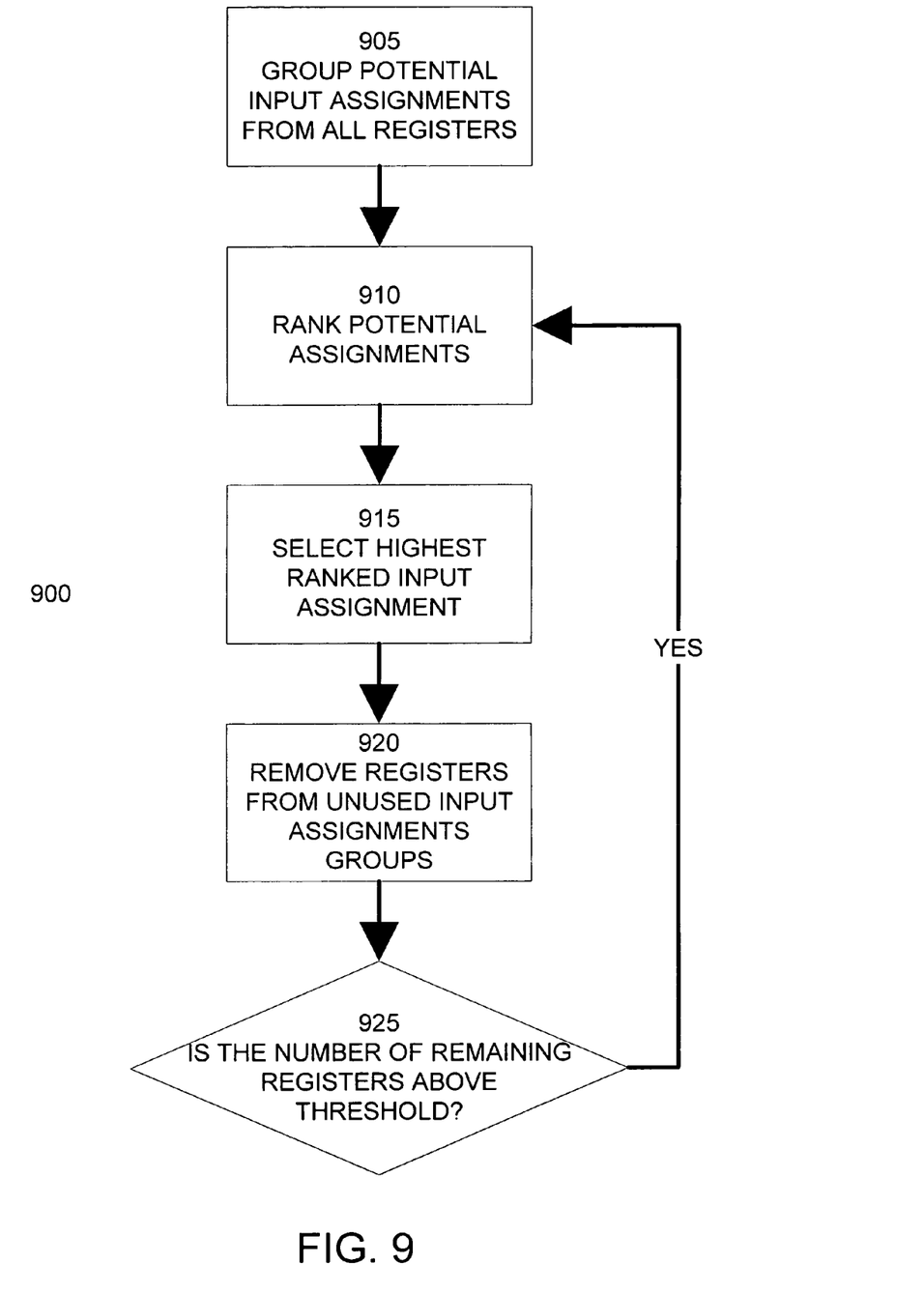
FIG. 9 illustrates a method for selecting one of a set of potential implementations of a user design to a programmable device according to an embodiment of the invention.

Once all of the potential input assignments have been determined for a user design, it is necessary to select an optimal set of input assignments that balances the gate savings using secondary hardware versus the routing costs for assigning inputs to the secondary hardware. FIG. 9 illustrates a method 900 for selecting one of a set of potential adaptations of a user design to a programmable device according to an embodiment of the invention.

At step 905, method 900 collects all of the potential input assignments previously determined for all the registers in a user design into groups of compatible input assignments. Compatible input assignments are input assignments that assign one or more of the same input variables to the same inputs of the secondary hardware. For example, if registers R15 and R30 both have a potential input assignment of the "orange" input variable to the sload input, then these two input assignments are compatible and are grouped together by step 905.

Table 5 illustrates an example set of potential input assignments. Each row of this table represents a group of compatible input assignments. Table 5 illustrates a relatively simple set of input assignments, and in an embodiment, there may be any number of potential input assignments, each including numerous input variable assignments. Further, each input assignment may be compatible with any number of registers.

TABLE 5

Example Set of Input Assignments

| INPUT ASSIGNMENT | RANK (REGISTER TOTAL) | REGISTERS |
|---|---|---|
| ORANGE = sload | 110 | R15, R30, R27, R900, R2, ... |
| ORANGE = sclear | 109 | R12, R55, ... |
| APPLE = sclear | 108 | R75, R89, R92, R111, R51, ... |
| APPLE = sdata; KIWI = sclear | 101 | R300, R275, R35, R19, R4, ... |

Step 910 then ranks the groups of potential input assignments. In an embodiment, groups are ranked by the number of registers in each group, which roughly correlates with the minimum routing cost of a user design. In the example of Table 5, the potential input assignment of "orange=sload" is used by 110 registers, while the potential input assignment of "orange=sclear" is used by 109 registers. Thus, the "orange=sload" assignment is the top ranked potential input assignment in this example. As each group represents a potential, rather than an actual, input assignment, there may be registers that belong to multiple groups. This corresponds to registers having two or more potential solutions, such as the example in FIGS. 5A-5D. In Table 5, registers R15, R30, R27, and R30 are all included in multiple input assignments.

In alternate embodiments, groups of potential input assignments may be ranked by one or more other factors. For example, if low power consumption is a goal, then the power consumption of each potential input assignment can be estimated and each group of potential input assignments ranked according to the power consumption savings using secondary hardware. Another potential factor is ranking groups of potential input assignments by the number of gates saved using secondary hardware rather than look-up tables or other logic devices. Yet another potential factor considers the types of gates used by the groups of potential input assignment, with a preference away from potential input assignments with difficult to implement gates, such as exclusive-or gates. These example factors, or any other factors, may be considered alone or in combination to rank groups of potential input assignments.

Step 915 selects the input assignment having the highest rank to implement the corresponding portion of the user design. Continuing with the previous example, the input assignment of "orange=sload," having 110 registers is selected as the optimal implementation of these registers of the user design, and this input assignment will become part of the programmable device configuration.

Step 920 removes registers selected in step 915 from any unselected potential input assignments. Step 920 ensures that two or more contradictory input assignments are not applied to the same register. Table 5 illustrates the application of step 920 for an example set of potential input assignments. For example, registers R15, R30, and R27 are included in the selected input assignment of "orange=sload" and the unselected potential input assignment of "orange=sclear." Because these registers are part of a selected input assignment, they are removed from any other potential input assignments. The removed registers are shown in strikethrough in Table 5. Similarly, register R30 is removed from the "apple=sclear" potential input assignment. If all of the registers are removed from a potential input assignment, this input assignment is discarded from further consideration.

Step 925 determines whether any other potential input assignments should be analyzed. In an embodiment, potential input assignments are analyzed until all possible configurations are exhausted. As discussed above, utilizing secondary hardware for logic functions can be tempered by the routing costs associated with a given input assignment. Because of this, an alternate embodiment determines whether the remaining number of registers (and hence the potential gate savings) has crossed a threshold where it is no longer effective to analyze potential input assignments. In one application of this embodiment, method 900 is completed if none of the remaining unselected potential input assignments have more than a predetermined number of registers, for example six registers.

Conversely, if step 925 determines that additional potential input assignments should be analyzed, then method 900 reiterates beginning with step 910. It should be noted that step 910 is reiterated in this embodiment of method 900 because the number of registers associated with each potential input assignment, and hence the ranking or ordering of potential input assignments, will change as registers are removed from potential input assignments by previous iterations of step 920. In Table 5, for example, after the selection of the "orange=sload" assignment and the removal of registers R15, R30, and R27 from the unselected input assignments, the "orange=sclear" assignment will have only 106 registers, while the "apple=sclear" assignment will have 107 registers. Thus, a subsequent iteration of step 910 will make the "apple=sclear" assignment the top ranked potential input assignment.

Figure 10:
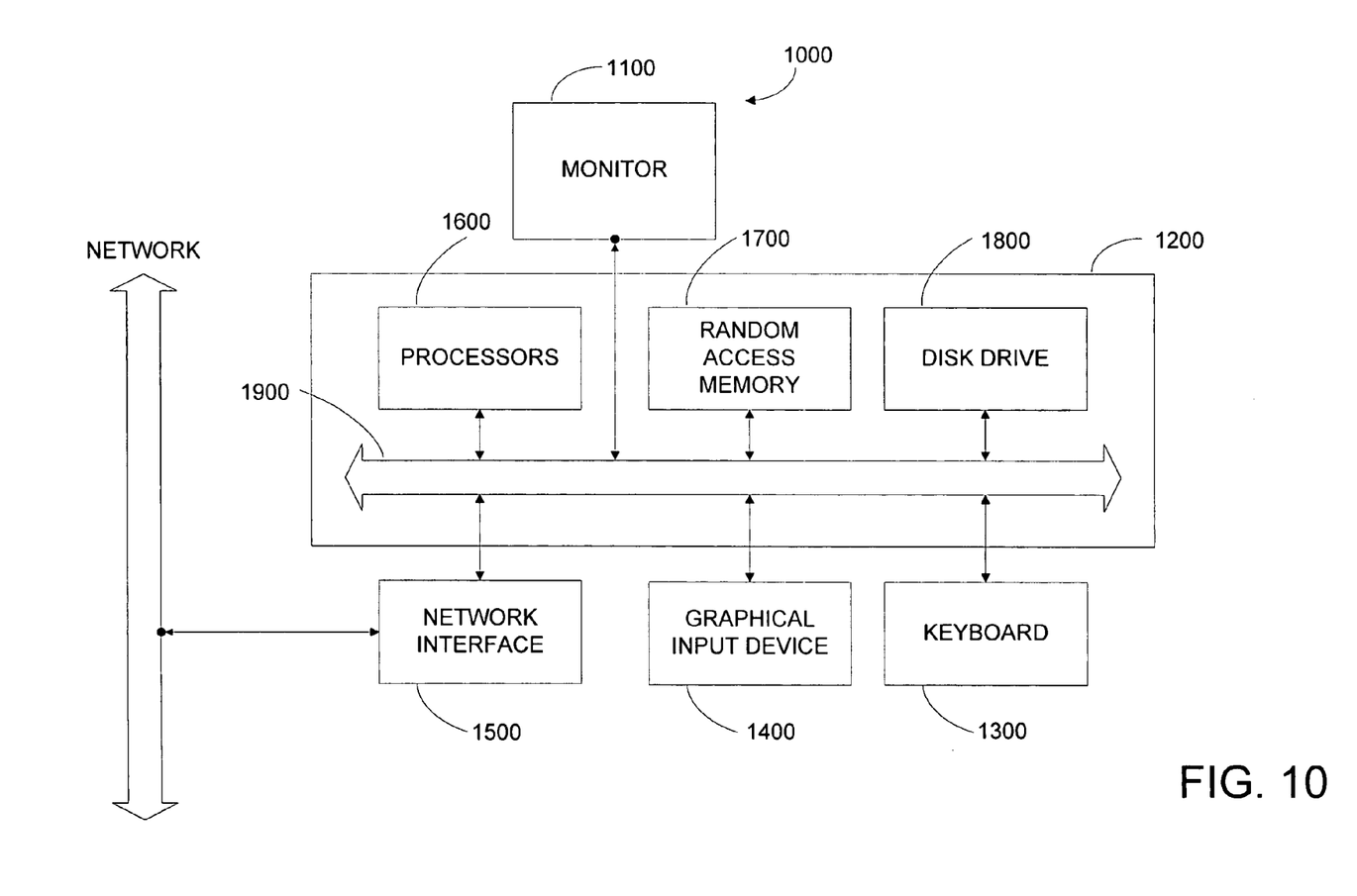
FIG. 10 illustrates an example computer system suitable for implementing an embodiment of the invention.

FIG. 10 illustrates an example computer system 1000 capable of implementing an embodiment of the invention. Computer system 1000 typically includes a monitor 1100, computer 1200, a keyboard 1300, a user input device 1400, and a network interface 1500. User input device 1400 includes a computer mouse, a trackball, a track pad, graphics tablet, touch screen, and/or other wired or wireless input devices that allow a user to create or select graphics, objects, icons, and/or text appearing on the monitor 1100. Embodiments of network interface 1500 typically provides wired or wireless communication with an electronic communications network, such as a local area network, a wide area network, for example the Internet, and/or virtual networks, for example a virtual private network (VPN).

Computer 1200 typically includes components such as one or more general purpose processors 1600, and memory storage devices, such as a random access memory (RAM) 1700, disk drives 1800, and system bus 1900 interconnecting the above components. RAM 1700 and disk drive 1800 are examples of tangible media for storage of data, audio/video files, computer programs, applet interpreters or compilers, virtual machines, embodiments of the herein described invention including geometric scene data, object data files, shader descriptors, a rendering engine, output image files, texture maps, and displacement maps. Further embodiments of computer 1200 can include specialized audio and video subsystems for processing and outputting audio and graphics data. Other types of tangible media include floppy disks; removable hard disks; optical storage media such as DVD-ROM, CD-ROM, and bar codes; non-volatile memory devices such as flash memories; read-only-memories (ROMS); battery-backed volatile memories; and networked storage devices.

Further embodiments can be envisioned to one of ordinary skill in the art after reading the attached documents. In other embodiments, combinations or sub-combinations of the above disclosed invention can be advantageously made. The block diagrams of the architecture and flow charts are grouped for ease of understanding. However it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A method of using a computer system to determine an implementation of a user design on a programmable device including a plurality of programmable logic elements, each comprising reconfigurable logic hardware and fixed-configuration secondary hardware, wherein the fixed-configuration secondary hardware has a plurality of inputs, the inputs common to at least two of the programmable logic elements, the method comprising:

for each of a plurality of portions of the user design, determining, with at least one processor of the computer system, one or more sets of input assignments of signals in the user design to the fixed-configuration secondary hardware, each set providing an implementation of a logic function of that portion of the user design using the fixed-configuration secondary hardware;

ranking, with the processor, the sets of input assignments by determining a number of times each set is assigned to the fixed-configuration secondary hardware;

selecting, with the processor, a highest ranked set of input assignments, wherein the highest ranked set is assigned to the fixed-configuration secondary hardware at least two or more times; and creating, with the processor, an implementation of a subset of the portions of the user design by implementing the selected set of input assignments as inputs to a corresponding subset of the plurality of fixed-configuration secondary hardware.

2. The method of claim 1, wherein each of the input assignments defines an assignment of at least one input variable of the user design to an input of the fixed-configuration secondary hardware.

3. The method of claim 1, wherein the fixed-configuration secondary hardware enables load and clear functions of a register of the programmable device.

4. The method of claim 1, wherein each set of the input assignments is associated with at least one register of the user design.

5. The method of claim 4, wherein ranking the input assignments includes determining a number of registers of the user design associated with each input assignment.

6. The method of claim 5, wherein selecting the highest ranked input assignment includes selecting the input assignment with the most associated registers.

7. The method of claim 4, comprising disassociating at least one register from at least one of the input assignments, wherein the disassociated register is associated with the selected input assignment.

8. The method of claim 1, comprising removing the selected input assignment from the input assignments, thereby forming a subset of the input assignments.

9. The method of claim 8, comprising evaluating a criteria for the subset of the input assignments; and
in response to a determination that the criteria exceeds a threshold, reiterating the steps of ranking the plurality of assignments, and selecting the highest ranked input assignment for the subset of the input assignments.

10. The method of claim 2, wherein determining one or more sets of input assignments comprises:
enumerating a plurality of sets of input variables associated with the portion of the user design; and
creating a plurality of input assignments from at least a portion of the sets of input variables.

11. The method of claim 10, further comprising:
creating a logic diagram describing the function of each of the plurality of sets of input variables; and
determining from the logic diagram whether the function of each of the plurality of sets of input variables corresponds with at least one function of the fixed-configuration secondary hardware.

12. The method of claim 11, wherein the logic diagram is a truth table.

13. The method of claim 11, wherein the logic diagram is a Karnaugh map.

14. The method of claim 11, wherein creating a plurality of input assignments comprises applying at least one heuristic to each of the plurality of sets of input variables having a function corresponding with at least one function of the fixed-configuration secondary hardware, thereby determining at least one corresponding assignment.

15. The method of claim 10, wherein enumerating a plurality of sets of input variables includes using cut enumeration.

16. An information storage medium including instructions adapted to operate an information processing device to perform a set of steps to implement a user design on an integrated circuit, the integrated circuit comprising a plurality of programmable logic elements, each comprising fixed-configuration secondary hardware, the instructions comprising:
for each of a plurality of portions of the user design, determining one or more sets of input assignments of signals in the user design to the fixed-configuration secondary hardware, each set providing an implementation of a logic function of that portion of the user design using the fixed-configuration secondary hardware;
ranking the sets of input assignments by determining a number of times each set is assigned to the fixed-configuration secondary hardware;
selecting the highest ranked set of input assignments; and
creating, with the processor, an implementation of a subset of the portions of the user design by implementing the selected set of input assignments as inputs to a corresponding subset of the plurality of fixed configuration secondary.

17. The information storage medium of claim 16, wherein each of the input assignments defines an assignment of at least one input variable of the user design to an input of the fixed-configuration secondary hardware.

18. The information storage medium of claim 16, wherein the fixed-configuration secondary hardware enables load and clear functions of a register of the programmable device.

19. The information storage medium of claim 16, wherein each set of the input assignments is associated with at least one register of the user design.

20. The information storage medium of claim 19, wherein ranking the input assignments includes determining a number of registers of the user design associated with each input assignment.

21. The information storage medium of claim 20, wherein selecting the highest ranked input assignment includes selecting the input assignment with the most associated registers.

22. The information storage medium of claim 19, comprising disassociating at least one register from at least one of the input assignments, wherein the disassociated register is associated with the selected input assignment.

23. The information storage medium of claim 16, comprising removing the selected input assignment from the input assignments, thereby forming a subset of the input assignments.

24. The information storage medium of claim 23, comprising evaluating a criteria for the subset of the input assignments; and
in response to a determination that the criteria exceeds a threshold, reiterating the steps of ranking the plurality of assignments and selecting the highest ranked input assignment for the subset of the input assignments.

25. The information storage medium of claim 17, wherein determining one or more sets of input assignments comprises:
enumerating a plurality of sets of input variables associated with the portion of the user design; and
creating a plurality of input assignments from at least a portion of the sets of input variables.

26. The information storage medium of claim 25, further comprising:
creating a logic diagram describing the function of each of the plurality of sets of input variables; and
determining from the logic diagram whether the function of each of the plurality of sets of input variables corresponds with at least one function of the fixed-configuration secondary hardware.

27. The information storage medium of claim 26, wherein the logic diagram is a truth table.

28. The information storage medium of claim 26, wherein the logic diagram is a Karnaugh map.

29. The information storage medium of claim 26, wherein creating a plurality of input assignments comprises applying at least one heuristic to each of the plurality of sets of input variables having a function corresponding with at least one function of the fixed-configuration secondary hardware, thereby determining at least one corresponding assignment.

30. The information storage medium of claim 25, wherein enumerating a plurality of sets of input variables includes using cut enumeration.

31. A method of using a computer system to determine an implementation of a user design on an integrated circuit, the user design comprising a plurality of logic gates and a plurality of registers, the integrated circuit comprising a plurality of programmable logic elements, each programmable logic element comprising a register, a lookup table, and a plurality of logic gates having a plurality of inputs, the method comprising:

for each register in the plurality of registers in the user design, using at least one processor of the computer system in:

determining a logic representation for each of one or more groups of at least one logic gate having a plurality of inputs, the at least one logic gate coupled to the input of the register in the user design;

determining at least one way to implement each logic representation using the plurality of logic gates in a programmable logic element; and         for each way, assigning a set of input signals of the at least one logic gate of the user design to inputs of the logic gates in the programmable logic element; then     for each input signal of a plurality of input signals to the logic gates coupled to input of registers in the user design:

determining, with the processor, a number of occurrences where the input signal is assigned to a same input of the logic gates in a respective programmable logic element;

determining, with the processor, a first input signal and a first input of the logic gates in the programmable logic elements, wherein the first input signal is assigned to the first input more than other input signals are assigned to an input of the logic gates in the programmable logic elements; and then     creating, with the processor, an implementation of the user design on the integrated circuit by implementing the first input signal as the first input of the logic gates in each of the programmable logic elements to which the first input signal was assigned to the first input of the logic gates of that respective programmable logic element.

32. The method of claim 31 wherein the logic gates provide load and clear functions for the register in a programmable logic element.

* * * * *

UNITED STATES PATENT AND TRADEMARK OFFICE
CERTIFICATE OF CORRECTION

PATENT NO. : 7,636,655 B1  Page 1 of 1
APPLICATION NO. : 10/731593
DATED : December 22, 2009
INVENTOR(S) : Gregg Baeckler It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1096 days.

Signed and Sealed this

Ninth Day of November, 2010

David J. Kappos
*Director of the United States Patent and Trademark Office*